(12) United States Patent
Gill et al.

(10) Patent No.: US 7,649,396 B2
(45) Date of Patent: Jan. 19, 2010

(54) SOFT ERROR RATE HARDENED LATCH

(75) Inventors: Balkaran Gill, Cornelius, OR (US);
Norbert Seifert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 30 days.

(21) Appl. No.: 11/905,293

(22) Filed: Sep. 28, 2007

(65) Prior Publication Data

US 2009/0085627 A1   Apr. 2, 2009

(51) Int. Cl.
*H03K 3/00* (2006.01)
(52) U.S. Cl. .................... 327/218; 327/199
(58) Field of Classification Search .............. None
See application file for complete search history.

(56) References Cited

U.S. PATENT DOCUMENTS

| | | | | |
|---|---|---|---|---|
| 5,111,429 A | * | 5/1992 | Whitaker | 365/156 |
| 5,341,031 A | * | 8/1994 | Kinoshita et al. | 327/259 |
| 5,799,048 A | * | 8/1998 | Farjad-Rad et al. | 375/360 |
| 6,058,041 A | * | 5/2000 | Golke et al. | 365/156 |
| 6,696,873 B2 | * | 2/2004 | Hazucha et al. | 327/203 |
| 6,864,732 B2 | * | 3/2005 | Chalasani | 327/203 |
| 7,038,515 B2 | * | 5/2006 | Rusu et al. | 327/208 |
| 2004/0130351 A1 | | 7/2004 | Hazucha et al. | 327/15 |

OTHER PUBLICATIONS

"Radiation-Induced Clock Jitter and Race;" Norbert Seifert et al; IEEE 05CH37616 43$^{rd}$ Annual International Reliability Physics Symposium, 2005, pp. 215-222.
"On the Scalability of Redundancy based SER Mitigation Schemes;" N. Seifert et al. ICICDT 2007 Invited paper; Submitted version Mar. 23, 2007; pp. 1-9.

* cited by examiner

*Primary Examiner*—Cassandra Cox
(74) *Attorney, Agent, or Firm*—KED & Associates, LLP

(57) ABSTRACT

A latch is provided that includes a first inverter, a second inverter, a first latch circuit and a second latch circuit. The first inverter to receive the first clock signal from an input port and to provide a clock signal. The second inverter to receive the first clock signal from the input port and to provide a clock signal. The first latch circuit is to store data and to receive a clock signal from the second inverter. The second latch circuit is further to store data and to receive a clock signal from the first inverter.

16 Claims, 4 Drawing Sheets

SOFT ERROR RATE HARDENED LATCH

BACKGROUND

1. Field

Embodiments of the present invention may relate to latches and/or other types of information storage circuits.

2. Background

A Single Event Upset (SEU) may change a value of a bit in a logic circuit. Single Event Upsets (SEUs) may be caused by natural radiation sources, such as alpha particles and cosmic rays, interacting with transistors included in a logic circuit. SEUs may be a significant source of soft errors in logic circuits. Any circuit node to which either a drain or a source of a metal-oxide semiconductor (MOS) transistor is attached may exhibit a random change of voltage due to an SEU, which may cause a soft error in the operation of the microprocessor. The consequence of a soft error may be an unwanted change of state of a microprocessor beyond control of a user program. This may lead to processing and storage of corrupted data. Soft errors, as opposed to hard errors, may not cause physical damage to the underlying circuitry, although erroneous operation caused by soft errors may result in physical damage to the circuit itself or other parts of the system.

BRIEF DESCRIPTION OF THE DRAWINGS

Arrangements and embodiments may be described in detail with reference to the following drawings in which like reference numerals refer to like elements and wherein.

DETAILED DESCRIPTION

Figure 1:
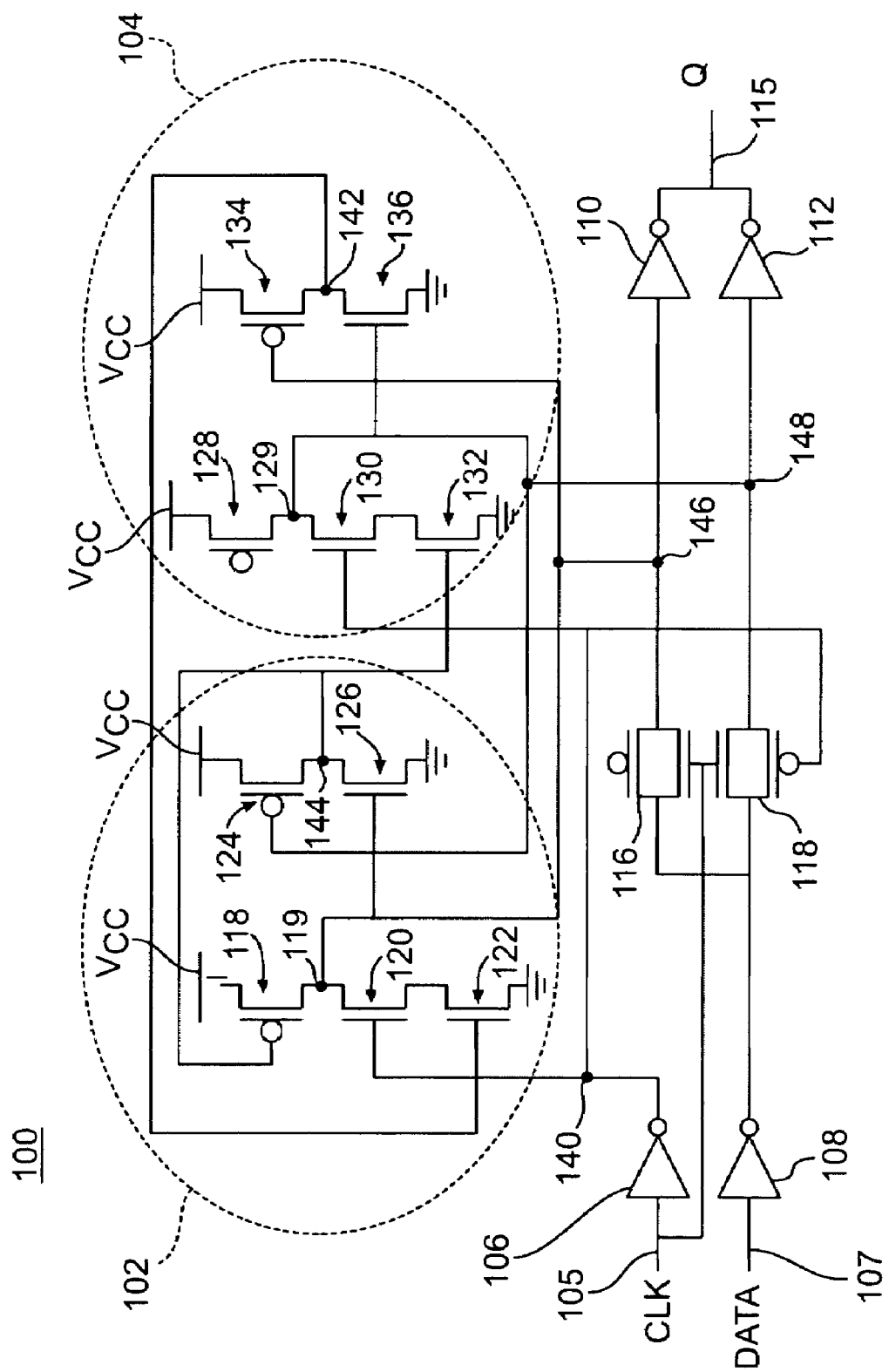
FIG. 1 is a circuit diagram of a latch according to an example arrangement.

In the following description, like reference numerals may be used to designate identical, corresponding or similar components in different drawings. Where specific details are set forth in order to describe example embodiments, it should be apparent to one skilled in the art that embodiments may be practiced without these details.

In the following description, items may be referred to by number, such as a first or second inverter. The numbering of the specific circuits, devices, latches, etc. in the specification is not intended to limit the scope of the claims. Rather, the numbering of items in the specification is merely for identification. Embodiments are not limited by this numbering.

FIG. 1 is a circuit diagram of a latch according to an example arrangement. Other arrangements may also be used. The latch shown in FIG. 1 may be called a SEU tolerant (SEUT) latch and/or a soft error rate hardened latch. More specifically, FIG. 1 shows a latch 100 that include a first latch circuit 102 to store data, a second latch circuit 104 to store data, a first inverter 106 (or NOT gate), a second inverter 108, a third inverter 110, a fourth inverter 112, a first passgate 116 (or transmission gate), a second passgate 118, a first state node 142, a second state node 144, a third state node 146, a fourth state node 148 and a clock node 140. Other nodes are provided and may be described below The first latch circuit 102 may include a first transistor 118, a second transistor 120, a third transistor 122, a fourth transistor 124 and a fifth transistor 126 that are each field effect transistors (FETs).

The first transistor 118 may be a P-channel FET (or PFET) having a source, a drain and a gate. The fourth transistor 124 may also be a P-channel FET (or PFET) having a source, a drain and a gate. On the other hand, the second transistor 120, the third transistor 122 and the fifth transistor 126 may each be N-channel FETs (or NFETs) having a source, a drain and a gate.

Additionally, the second latch circuit 104 may include a sixth transistor 128, a seventh transistor 130, an eighth transistor 132, a ninth transistor 134 and a tenth transistor 136 that are each field effect transistors. The sixth transistor 128 and the ninth transistor 134 may each be P-channel FETs (or PFETs) having a source, a drain and a gate. The seventh transistor 130, the eighth transistor 132 and the tenth transistor 136 may each be N-channel FETs (or NFETs) having a source, a drain and a gate.

An output of the first latch circuit 102 at node 119 is coupled to an input of the second latch circuit 104, namely a gate of the transistor 134, and is coupled to a gate of the transistor 126 as well as the node 146. Likewise, an output of the second latch circuit 104 at node 129 is coupled to an input of the first latch circuit 102, namely a gate of the transistor 124 and is coupled to a gate of the transistor 136 as well as to the node 148. In this way, a data signal path of the first latch circuit 102 is cross-coupled with the second latch circuit 104.

As is shown in FIG. 1, a clock signal CLK may be applied at an input port 105 to the inverter 106. The inverter 106 may apply an inverted clock signal to a gate of the transistor 120 of the first latch circuit 102 and to a gate of the transistor 130 of the second latch circuit 320. The inverted clock signal may also be applied to gates of the PFET transistors forming the first passgate 116 and the second passgate 118. The clock signal CLK may also be applied to gates of the NFET transistors forming the first passgate 116 and the second passgate 118. Accordingly, the same clock signal is applied to the first latch circuit 102, the second latch circuit 104 and the passgates 116, 118. This arrangement may allow synchronization of the first latch circuit 102 and the second latch circuit 104.

Additionally, a data signal DATA may be applied at an input port 107 to the inverter 108. The inverted data signal may then be applied to the first passgate 116 and the second passgate 118.

The output configuration may include the inverters 110, 112 (or buffers) that are intended to simultaneously drive an output port 115 (having an output Q). Sizing and topology of the inverters 110, 112 may be symmetrical.

The latch 100 may provide a high level of protection to particle strikes occurring at the state nodes 142, 144, 146 and 148, thereby resulting in a reduced Soft Error Rate (SER). However, an internal clock node may not be fully protected against particle strikes. For example, if a particle strike occurs at the internal clock node 140, then the first and second passgates 116 and 118 coupled to the data input port may both be turned on. New data may then be written to the latch 100 and thereby cause data corruption. The data corruption may occur when new written data is different from the stored data.

Additionally, for writing data, the clock (CLK) to output (Q) delay may dramatically increase as a supply voltage (Vcc) is scaled down. This may cause minimum Vcc (also called Vccmin) issues for writing data. Such a condition may occur when the state nodes 146 and 148 store "1" and new data is written to these nodes is "0" because the clock signal CLK only turns off the NFET transistor which on the PFET transistors caused contention at the state nodes 146 and 148.

Figure 2:
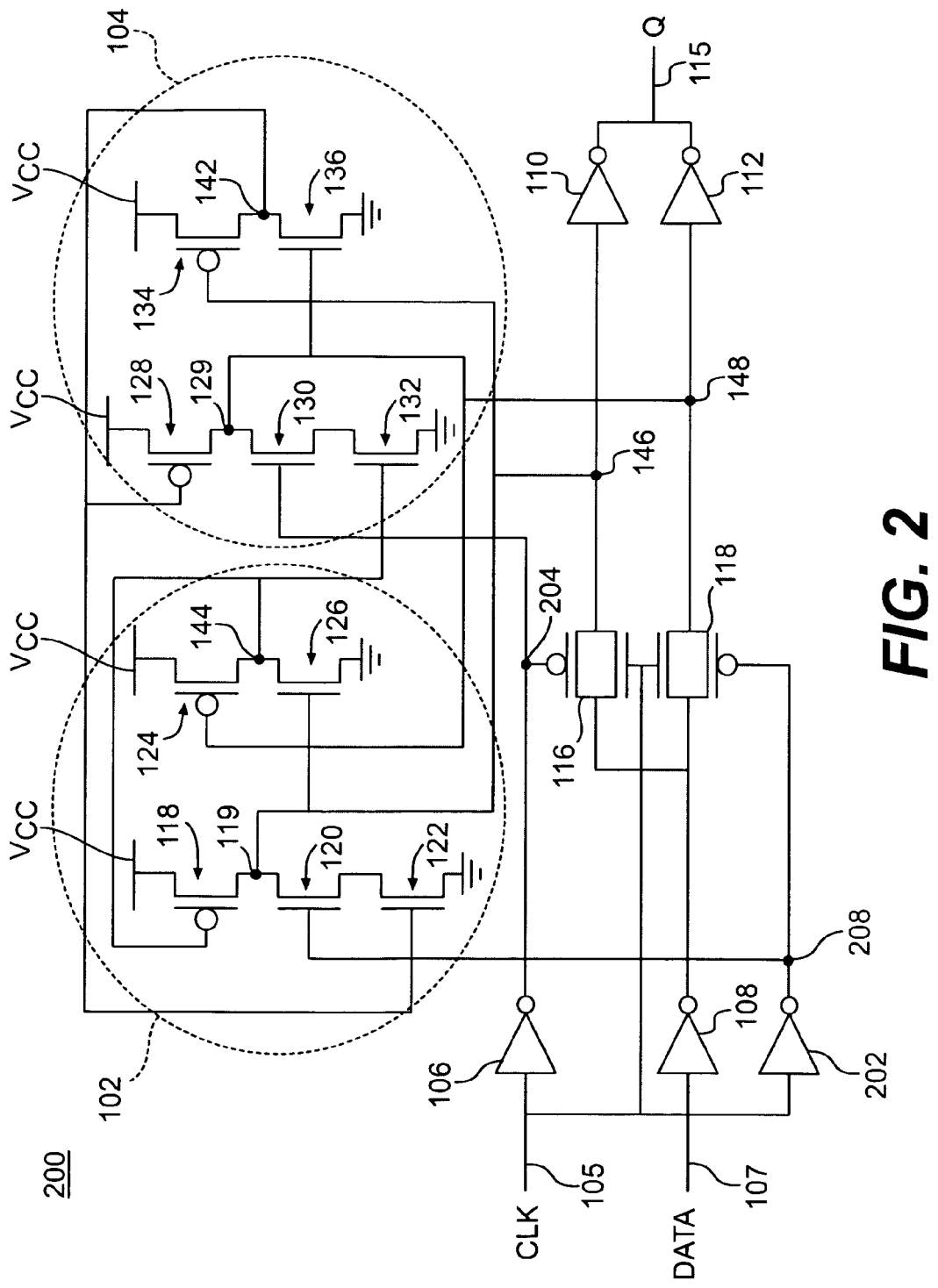
FIG. 2 is a circuit diagram of a soft error rate (SER) hardened latch according to an example embodiment of the present invention.

FIG. 2 is a circuit diagram of a soft error rate (SER) hardened latch according to an example embodiment of the present invention. Other embodiments and configurations are also within the scope of the present invention. More specifically, FIG. 2 shows a SER hardened latch 200 having the first latch circuit 102 to store data, the second latch circuit 104 to store data, the first inverter 106 (or NOT gate), the second inverter 108, the third inverter 110, the fourth inverter 112, a fifth inverter 202, the first passgate 116 (or transmission gate) and the sixth passgate 118. The latch 200 also includes the first state node 142, the second state node 144, the third state node 146, the fourth state node 148, a first clock node 204 and a second clock node 208. Other nodes are provided and may be described below.

The latch 200 may protect the state nodes 142, 144, 146 and 148 as well as the clock nodes 204 and 208 thereby resulting in a relatively lower (or substantial reduction in) Soft Error Rate (SER). The latch 200 may also protect the clock nodes 204 and 208 located inside the latch 200 thereby dramatically improving the overall SER. The latch 200 may improve the overall SER by reducing susceptibility of the clock nodes 204 and 208 against particle strikes. This may be in addition to of the SER immunity to single upset strikes of the state nodes 142, 144, 146 and 148.

In the latch 200, the internal clock node (or the local clock tree within the latch 200) may be split into two branches. This may be done to add clock node redundancy and thereby mitigate the clock node SER. This may also reduce the clock node SEU. For example, the clock signal CLK may be applied at the input port 105 to the inverter 106. An inverted clock signal from the inverter 106 may be provided at the first clock node 204. The inverted clock signal may be applied to a gate of the transistor 130 (of the second latch circuit 104) and to a gate of the PFET transistor forming the first passgate 116. The clock signal CLK may also be applied at the input port 105 to the inverter 202. An inverted clock signal from the inverter 202 may be provided at the second clock node 208. The inverted clock signal may be applied to a gate of the transistor 120 (of the first latch circuit 102) and to a gate of the PFET transistor forming the second passgate 118. Accordingly, the clock signal applied to the first latch circuit 102 is different than the clock signal applied to the second latch circuit 104. Further, the clock signal at the clock node 204 is different than the clock signal at the clock node 208.

A particle hit or strike at any one of the clock nodes (i.e., either the first clock node 204 or the second clock node 208) may turn on only one of the PFET transistors forming the first and second passgates 116 and 118 and thereby allowing the DATA input to flow therethrough. That is, a particle hit or strike at the first clock node 204 may turn on only the PFET transistor forming the first passgate 116. On the other hand, a particle hit or strike at the second clock node 208 may turn on only the PFET transistor forming the second passgate 118. Under either of these scenarios, appropriate data will be output from the output port 115.

Figure 3:
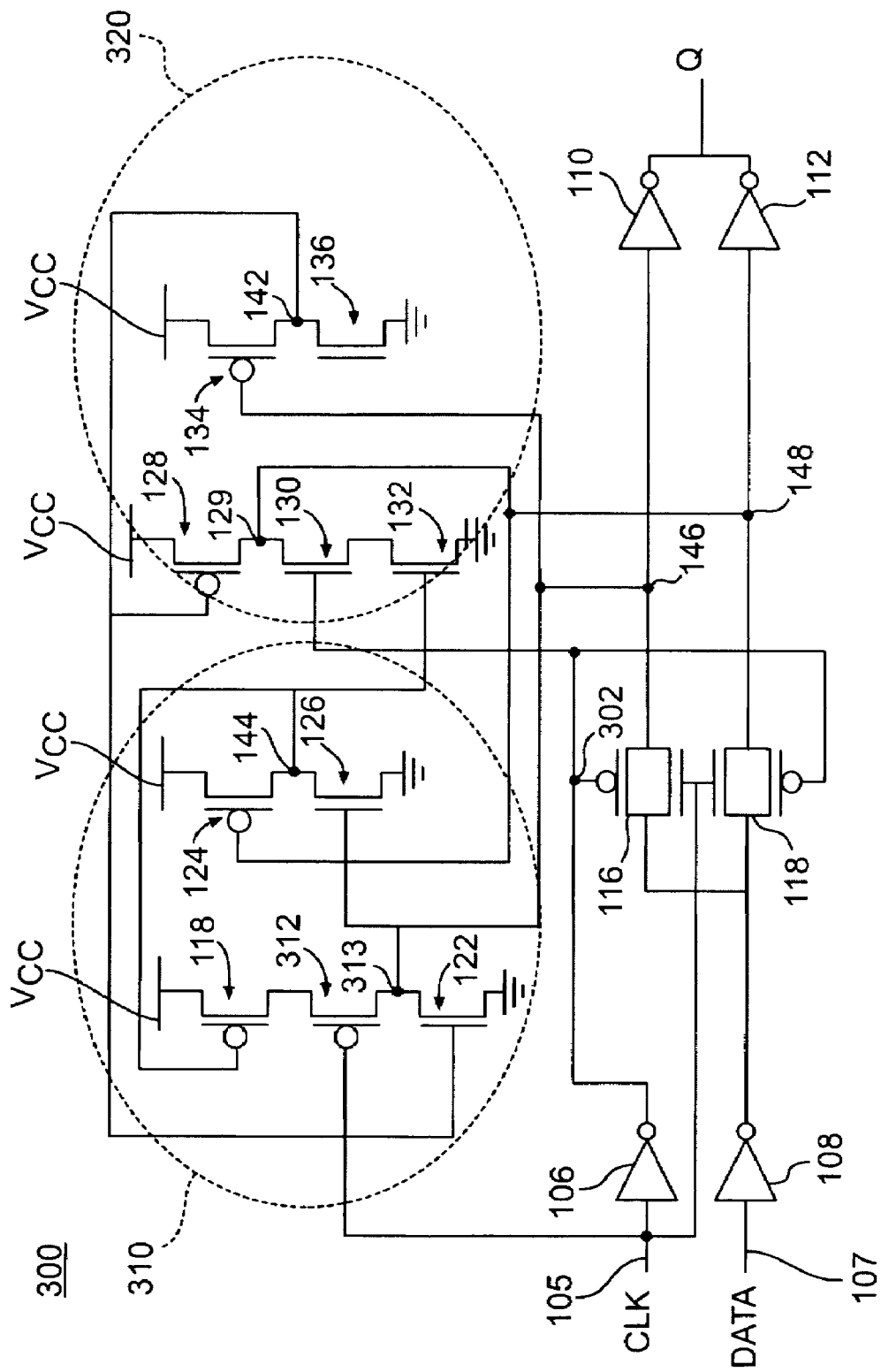
FIG. 3 is a circuit diagram of a soft error rate (SER) hardened latch according to an example embodiment of the present invention.

FIG. 3 is a circuit diagram of a soft error rate (SER) hardened latch according to an example embodiment of the present invention. Other embodiments and configurations are also within the scope of the present invention. More specifically, FIG. 3 shows a SER hardened latch 300 that includes a first latch circuit 310 to store data, a second latch circuit 320 to store data, the first inverter 106 (or NOT gate), the second inverter 108, the third inverter 110, the fourth inverter 112, the first passgate 116 (or transmission gate), and the second passgate 118. The second latch circuit 320 may correspond to the second latch circuit 104 discussed above. The latch 300 may also include the first state node 142, the second state node 144, the third state node 146, the fourth state node 148 and a clock node 302. Other nodes are provided and may be described below.

The first latch circuit 310 may include the first transistor 118, an eleventh transistor 312, the third transistor 122, the fourth transistor 124 and the fifth transistor 126. The first, fourth and eleventh transistors 118, 124 and 312 may each be a P-channel FETs (or PFET) each having a source, a drain and a gate. The third transistor 122 and the fifth transistor 126 may each be N-channel FETs (or NFETs) each having a source, a drain and a gate.

In the latch 300, one of the clock controlled interruptible NFET transistor of the set of NFET transistors in the latch 100 (FIG. 1) may be replaced with a PFET transistor in the latch 300. For example, the eleventh transistor 312, which is a PFET transistor, replaces the NFET transistor 120 of the latch 100. This may minimize the contention for writing data thereby resulting in improvement of the minimum operational voltage of the latch 300 (of FIG. 3). Thus, the first latch circuit 310 may include three PFET transistors 118, 124 and 312 and two NFET transistors 122 and 126.

As is shown in FIG. 3, the clock signal CLK may be applied at the input port 105 to the inverter 106. The inverter 106 may apply an inverted clock signal to a gate of the transistor 130 of the second latch 320. The clock signal CLK at the input port 105 may also be applied to a gate of the transistor 312 of the first latch circuit 312 and to gates of the NFET transistors of the first and second passgates 116, 118. Accordingly, different clock signals may be applied to the first latch circuit 310 and the second latch circuit 320.

An output of the first latch circuit 310 at node 313 is coupled to an input of the second latch circuit 320, namely a gate of the transistor 134, and is coupled to a gate of the transistor 126 as well as the node 146. Likewise, an output of the second latch circuit 320 at node 129 is coupled to an input of the first latch circuit 310, namely a gate of the transistor 124, and is coupled to a gate of the transistor 136 as well as the node 148.

Figure 4:
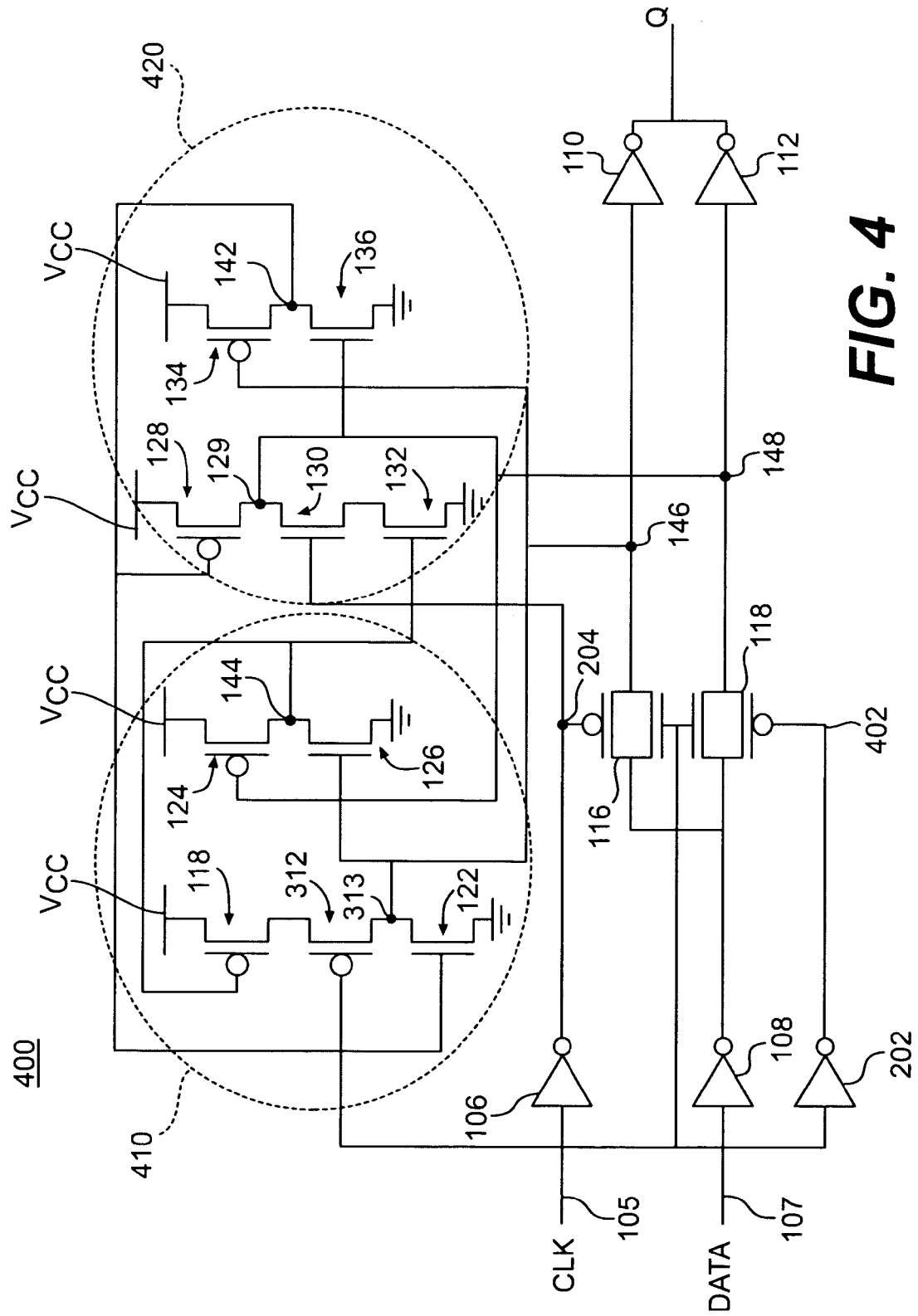
FIG. 4 is a circuit diagram of a soft error rate (SER) hardened latch according to an example embodiment of the present invention.

FIG. 4 is a circuit diagram of a soft error rate (SER) hardened latch according to an example embodiment of the present invention. Other embodiments and configurations are also within the scope of the present invention. More specifically, FIG. 4 shows a latch 400 that includes a first latch circuit 410 to store data, a second latch circuit 420 to store data, the first inverter 106 (or NOT gate), the second inverter 108, the third inverter 110, the fourth inverter 112, the fifth inverter 202, the first passgate 116 (or transmission gate) and the second passgate 118. The first latch circuit 410 may correspond to the latch circuit 310 discussed above with respect to FIG. 3. The second latch circuit 420 may correspond to the latch circuit 104 discussed above. The latch 400 may also include the first state node 142, the second state node 144, the third state node 146, the fourth state node 148, the first clock node 204 and a second clock node 402. Other nodes are provided and may be described.

The latch 400 may protect the state nodes 142, 144, 146 and 148 as well as the clock nodes 204 and 402 thereby resulting in a relatively lower (or substantial reduction in) Soft Error Rate (SER). The latch 400 may improve the SER by reducing susceptibility of the clock nodes 204 and 402 against particle strikes. This may be in addition to the SER immunity to single upset strikes of the state nodes 142, 144, 146 and 148. The latch 400 may protect the clock nodes 204 and 402 located inside the latch 400 thereby improving the overall SER.

The latch 400 may also improve the minimum Vcc at which this latch 400 is operational without significantly increasing the Clock to Q delay. For example, the latch 400 may have an improved write Vccmin.

In the latch 400, the internal clock node (or the local clock tree within the latch 400) may be split into two branches. This may add clock node redundancy and thereby mitigate the clock node SER. This may also reduce the clock node SEU. For example, the clock signal CLK may be applied at the input port 105 to the inverter 106. An inverted clock signal from the inverter 106 may be provided at the first clock node 204. The inverted clock signal may be applied to a gate of the transistor 130 (of the second latch circuit 420) and to a gate of the PFET transistor forming the first passgate 116. The clock signal CLK may be applied to a gate of the transistor 312. The clock signal CLK may also be applied at the input port 105 to the inverter 202. An inverted clock signal from the inverter 202 may be provided at the second clock node 402 and to a gate of the PFET transistor forming the second passgate 118. Accordingly, the clock signal applied to the first latch circuit 410 is different than the clock signal applied to the second latch circuit 420. Further, the clock signal at the clock node 204 is different than the clock signal at the clock node 402.

Embodiments of the present invention may provide a SER hardened latch that includes a first inverter, a second inverter, a first latch circuit to store data and a second latch circuit to store data. The first inverter to receive a first clock signal from an input port and to provide a second clock signal. The second inverter to receive the first clock signal from the input port and to provide a third clock signal. The first latch circuit to receive the third clock signal from the second inverter and the second latch circuit to receive the second clock signal from the first inverter.

Additionally, embodiments of the present invention may also include an SER hardened latch that includes a first inverter, a first latch circuit to store data and a second latch circuit to store data. The first inverter to provide a second clock signal based on the first clock signal. The first latch circuit to receive a third clock signal based on the first clock signal. The second latch circuit to receive the second clock signal from the first inverter. The third clock signal is different than the first clock signal.

In the description of this invention, the terms "system" and "circuit" may be used interchangeably. The terms "system" and "circuit" are used interchangeably to refer to a circuit that has been designed and implemented herein for managing errors with controlled operational voltage.

In the above description, the terms NFET and PFET have been used. An NFET may be a n-channel metal oxide field effect transistor or an n-channel FET, for example. A PFET may be a p-channel metal oxide field effect transistor or a p-channel polysilicon FET, for example.

As used herein, the term "soft error rate or SER" may refer to a rate at which a device or system encounters (or is predicted to encounter) soft errors. SER may be expressed as either number of failures-in-time (FIT), or mean-time-between-failures (MTBF).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A latch comprising:
    an input port to provide a first clock signal;
    a data input port to receive a data signal;
    a first inverter to receive the first clock signal from the input port and to provide a second clock signal;
    a second inverter to receive the first clock signal from the input port and to provide a third clock signal;
    a first passgate and a second passgate each to receive the data signal;
    a first latch circuit to store data, the first latch circuit to receive the third clock signal from the second inverter; and
    a second latch circuit to store data, the second latch circuit to receive the second clock signal from the first inverter.

2. The latch of claim 1, wherein the first passgate comprises a P-channel metal oxide field effect transistor (PMOS) and an n-channel metal oxide field effect transistor (NMOS), and the second passgate comprises a PMOS transistor and an NMOS transistor.

3. The latch of claim 2, wherein the second clock signal is applied to a gate of the PMOS transistor of the first passgate and the third clock signal is applied to a gate of the PMOS transistor of the second passgate.

4. The latch of claim 1, wherein the second clock signal is applied to a n-channel metal oxide field effect (NMOS) transistor of the second latch circuit, and the third clock signal is applied to an NMOS transistor of the first latch circuit.

5. A latch comprising:
    an input port to provide a first clock signal;
    a first inverter to provide a second clock signal based on the first clock signal;
    a first latch circuit to store data and to receive a third clock signal based on the first clock signal; and
    a second latch circuit to store data and to receive the second clock signal from the first inverter, the third clock signal being different than the first clock signal, and the third clock signal minimizes a supply voltage.

6. The latch of claim 5, wherein the third clock signal is applied to a p-channel metal oxide field effect transistor (PMOS) of the first latch circuit, and the second clock signal is applied to an n-channel metal oxide field effect transistor (NMOS) of the second latch circuit.

7. The latch of claim 5, further comprising a second inverter to receive the first clock signal and to provide the third clock signal to the first latch circuit.

8. The latch of claim 5, further comprising a first passgate and a second passgate each to receive the data signal.

9. The latch of claim 8, wherein the first passgate comprises a P-channel metal oxide field effect (PMOS) transistor and an n-channel metal oxide field effect (NMOS) transistor, and the second passgate comprises a PMOS transistor and an NMOS transistor.

10. The latch of claim 9, wherein the second clock signal is applied to a gate of the PMOS transistor of the first passgate and the third clock signal is applied to a gate of the PMOS transistor of the second passgate.

11. The latch of claim 5, wherein the second clock signal is applied to an n-channel metal oxide field effect transistor (NMOS) of the second latch circuit, and the third clock signal is applied to an NMOS transistor of the first latch circuit.

12. A latch comprising:
an input port to provide a first clock signal;
a first inverter to receive the first clock signal from the input port and to provide a second clock signal;
a second inverter to receive the first clock signal from the input port and to provide a third clock signal;
a first latch circuit to store data, the first latch circuit to receive the third clock signal from the second inverter; and
a second latch circuit to store data, the second latch circuit to receive the second clock signal from the first inverter, and the second clock signal is applied to a n-channel metal oxide field effect (NMOS) transistor of the second latch circuit, and the third clock signal is applied to an NMOS transistor of the first latch circuit.

13. The latch of claim 12, further comprising a data input port to receive a data signal.

14. The latch of claim 13, further comprising a first passgate and a second passgate each to receive the data signal.

15. The latch of claim 14, wherein the first passgate comprises a P-channel metal oxide field effect transistor (PMOS) and an n-channel metal oxide field effect transistor (NMOS), and the second passgate comprises a PMOS transistor and an NMOS transistor.

16. The latch of claim 15, wherein the second clock signal is applied to a gate of the PMOS transistor of the first passgate and the third clock signal is applied to a gate of the PMOS transistor of the second passgate.

* * * * *